United States Patent
Higuchi et al.

(10) Patent No.: US 11,592,741 B2
(45) Date of Patent: Feb. 28, 2023

(54) IMPRINTING METHOD, SEMICONDUCTOR DEVICE MANUFACTURING METHOD AND IMPRINTING APPARATUS

(71) Applicant: KIOXIA CORPORATION, Tokyo (JP)

(72) Inventors: Takeshi Higuchi, Yokohama Kanagawa (JP); Hirokazu Kato, Kariya Aichi (JP); Kasumi Okabe, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/005,266

(22) Filed: Aug. 27, 2020

(65) Prior Publication Data
US 2021/0072640 A1    Mar. 11, 2021

(30) Foreign Application Priority Data
Sep. 6, 2019    (JP) .............................. JP2019-163414

(51) Int. Cl.
*G03F 7/00* (2006.01)
*H01L 21/027* (2006.01)
*G03F 7/16* (2006.01)

(52) U.S. Cl.
CPC ............ *G03F 7/0002* (2013.01); *G03F 7/162* (2013.01); *H01L 21/0271* (2013.01)

(58) Field of Classification Search
None
See application file for complete search history.

(56) References Cited

U.S. PATENT DOCUMENTS

| | | | | |
|---|---|---|---|---|
| 5,874,128 A | * | 2/1999 | Kim | G03F 7/162 427/240 |
| 8,011,916 B2 | | 9/2011 | Suehira et al. | |
| 2006/0241004 A1 | * | 10/2006 | Somervell | G03F 7/168 510/170 |
| 2008/0008971 A1 | * | 1/2008 | Shiba | G03F 7/038 430/330 |
| 2008/0028958 A1 | * | 2/2008 | Park | B29C 43/222 101/212 |
| 2011/0189601 A1 | | 8/2011 | Koshiba | |

(Continued)

FOREIGN PATENT DOCUMENTS

JP    2008226877 A    9/2008
JP    2010225693 A    10/2010

(Continued)

*Primary Examiner* — James M Mellott
(74) *Attorney, Agent, or Firm* — Kim & Stewart LLP

(57) ABSTRACT

An imprinting method includes dispensing a first liquid on a first region of a substrate. The first liquid is a photocurable resist precursor. A second liquid is dispensed on a second region of the substrate. The second region is adjacent to and surrounding the first region. The second liquid is non-photocurable as dispensed. The first region is then irradiated with light while a patterned template is being pressed against the first liquid. The light cures the first liquid and forms a resist pattern corresponding to the patterned template. The patterned template and the substrate are then separated from each other. The second liquid is then selectively removed from the substrate while leaving the resist pattern on the substrate.

12 Claims, 4 Drawing Sheets

(56) References Cited

U.S. PATENT DOCUMENTS

| | | | |
|---|---|---|---|
| 2012/0021609 A1* | 1/2012 | Parbhoo | ............... B05D 1/002 |
| | | | 438/763 |
| 2013/0251906 A1 | 9/2013 | Takimoto | |
| 2014/0213058 A1 | 7/2014 | Matsunaga et al. | |
| 2015/0224536 A1 | 8/2015 | Koshiba et al. | |
| 2016/0276151 A1* | 9/2016 | Liu | ........................ G03F 7/162 |
| 2020/0379342 A1* | 12/2020 | Tavakkoli Kermani | |
| | | Ghariehali | ............ G03F 7/0002 |

FOREIGN PATENT DOCUMENTS

| | | | |
|---|---|---|---|
| JP | 2011018722 A | 1/2011 | |
| JP | 2011159764 A | 8/2011 | |
| JP | 6141500 B2 | 9/2013 | |
| JP | 2013197389 A | 9/2013 | |
| JP | 5971561 B2 | 8/2016 | |

\* cited by examiner

IMPRINTING METHOD, SEMICONDUCTOR DEVICE MANUFACTURING METHOD AND IMPRINTING APPARATUS

CROSS-REFERENCE TO RELATED APPLICATION(S)

This application is based upon and claims the benefit of priority from Japanese Patent Application No. 2019-163414, filed Sep. 6, 2019, the entire contents of which are incorporated herein by reference.

FIELD

Embodiments described herein relate generally to an imprinting method, a semiconductor device manufacturing method, and an imprinting apparatus.

BACKGROUND

An imprinting method is known as a method for forming a fine pattern in a semiconductor device manufacturing process. The imprinting method involves dispensing a resist onto a to-be-processed film, pressing a patterned template against the dispensed resist, and then curing the resist, thereby transferring the pattern of the template into the resist.

When a template is pressed against a resist in the known imprinting method, the resist sometimes leaks from the periphery of the template and moves up on the side wall of the template. This may cause a so-called leakage defect when such a leaked portion of the resist is later cured.

DETAILED DESCRIPTION

Embodiments provide an imprinting method, a semiconductor device manufacturing method, and an imprinting apparatus which can reduce resist leakage defects.

In general, according to one embodiment, an imprinting method comprises dispensing a first liquid on a first region of a substrate. The first liquid is a photocurable resist precursor. A second liquid is dispensed on a second region of the substrate. The dispensing of the second liquid may occur before or after the dispensing of the first liquid. The second region is adjacent to and surrounding the first region. The first region is then irradiated with light while a patterned template is being pressed against the first liquid. The second liquid is non-photocurable as dispensed. That is, the second liquid alone would not photocure (solidify) substantially under the irradiation used on the first region. However, the light cures the first liquid and forms a resist pattern corresponding to the patterned template. The patterned template and the substrate are then separated from each other. The remaining (uncured) second liquid is then selectively removed from the substrate while leaving the resist pattern on the substrate.

Example embodiments of the present disclosure will now be described with reference to the drawings. These example embodiments are not limiting of the present disclosure. It should be understood that various modifications and adoptions of the described components or elements, or equivalents, which are substantially the same as the described components or elements, or those which would be obvious to those of ordinary skill in the art, are within the scope of the present disclosure.

EMBODIMENT 1

A first embodiment (Embodiment 1) will now be described with reference to the drawings.

Example of Configuration of Imprinting Apparatus

Figure 1:
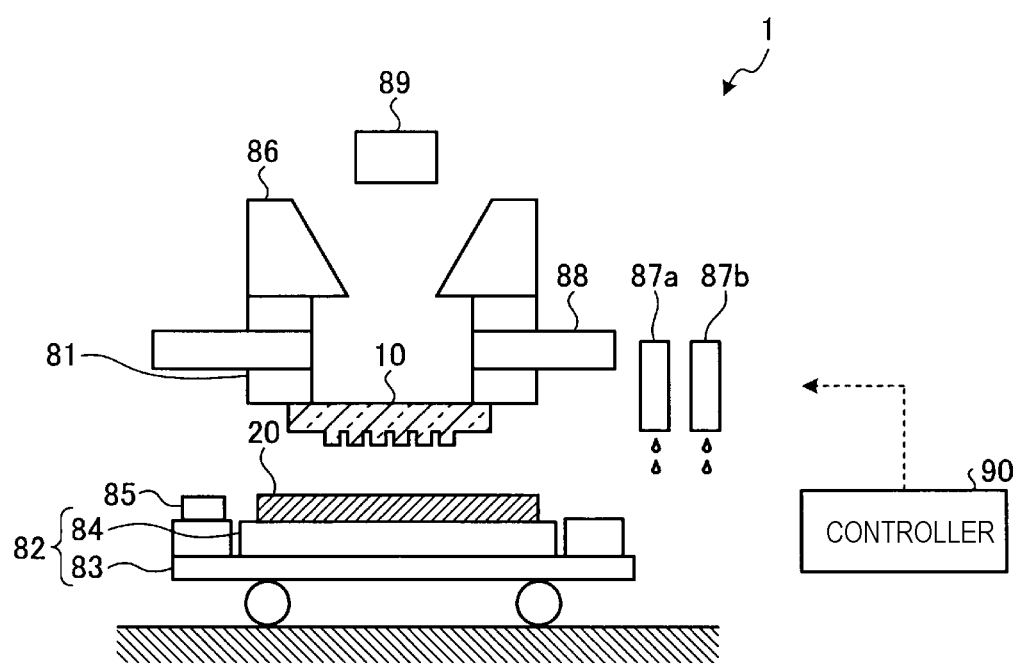
FIG. 1 is a diagram of an imprinting apparatus according to a first embodiment.

FIG. 1 is a diagram showing an example of a configuration of an imprinting apparatus 1 of Embodiment 1. As shown in FIG. 1, the imprinting apparatus 1 includes a template stage 81, a wafer stage 82, a reference mark 85, an alignment sensor 86, liquid dropping devices 87a, 87b, a stage base 88, a light source 89, a controller 90, and a storage unit 91. A template 10 for transferring a fine pattern to a wafer 20 by forming a resist pattern thereon has been installed on the imprinting apparatus 1. The resist pattern is formed from a resist precursor material, such as an organic pre-polymer liquid which photocures to a solid resin material.

The liquid precursor material and the cured material may both be referred to as "resist" in some contexts.

The wafer stage 82 as a substrate stage includes a wafer chuck 84 and a body 83. The wafer chuck 84 fixes/holds the wafer 20 in place at a predetermined position on the body 83. The wafer 20 may be referred to as a semiconductor substrate. The reference mark 85 is provided on the wafer stage 82. The reference mark 85 is used for positioning of the wafer 20.

The wafer stage 82 moves in a plane (horizontal plane) parallel to the main surface of wafer 20. When the wafer 20 has been loaded on the wafer stage 82, wafer stage 82 moves the wafer 20 to a position below the liquid dropping devices 87a, 87b for dispensing liquid onto the wafer 20. Next, the wafer stage 82 moves the wafer 20 to a position below the template 10 for performing pattern transfer processing on the wafer 20.

The stage base 88 supports the template 10 along with the template stage 81, and moves vertically to press a fine pattern of the template 10 against the liquid (resist precursor) on the wafer 20.

The alignment sensor 86 is provided on the stage base 88. The alignment sensor 86 detects the position of the wafer 20 and the position of the template 10 based on alignment marks provided on the wafer 20 and alignment marks provided on the template 10.

The liquid dropping devices 87a, 87b are devices each for dispensing liquid onto the wafer 20 by an ink-jet method. An ink-jet head, provided in each of the liquid dropping devices 87a, 87b, has a plurality of fine holes for ejecting droplets of the liquid resist precursor onto the wafer 20. The liquid dropping devices 87a, 87b may dispense different liquids.

The light source 89 is a device emitting, for example, ultraviolet light, and is provided above the stage base 88. The light source 89 irradiates resist precursor with light from above through the template 10 while the template 10 is pressing against the resist precursor on the wafer 20.

The controller 90 controls the template stage 81, the wafer stage 82, the reference mark 85, the alignment sensor 86, the liquid dropping devices 87a, 87b, the stage base 88, and the light source 89 as necessary for performing imprinting on the wafer 20 with the template 10.

Semiconductor Device Manufacturing Method

An example of a semiconductor device manufacturing method, including imprinting processing using the imprinting apparatus 1 of Embodiment 1, will now be described with reference to FIGS. 2A-2D and 3A-3B. FIGS. 2A through 2D illustrate steps of a semiconductor device manufacturing method according to the Embodiment 1. In FIGS. 2A through 2D, the parts (a) are cross-sectional views, as are FIGS. 3A and 3B. In FIGS. 2A through 2D, parts (b) are top down, plan views of the wafer 20 being processed.

Figure 2A:
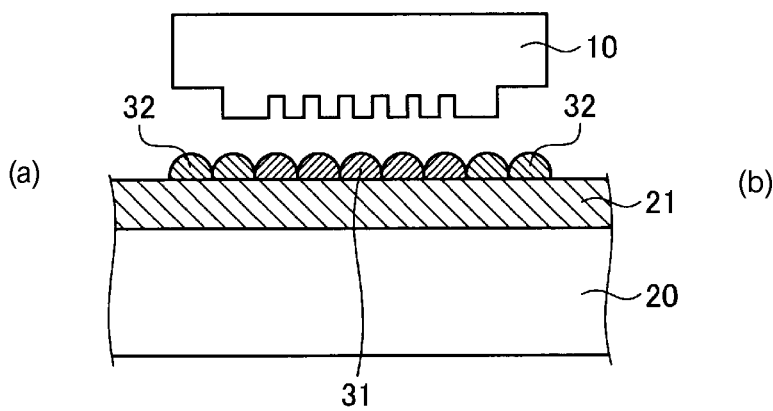
FIGS. 2A through 2D illustrate aspects of a semiconductor device manufacturing method according to a first embodiment.
Figure 2A:
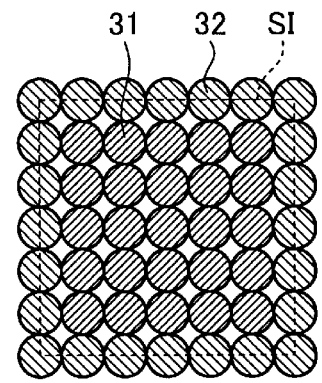

As shown in FIG. 2A, a to-be-processed film 21 is formed on the wafer 20, and organic liquids 31, 32 (also referred to as organic chemicals 31, 32) are dispensed as droplets onto the to-be-processed film 21. The organic liquid 31 is a photocurable resist material. The organic liquid 32 is a non-photocurable organic chemical.

More specifically, the organic liquid 31 comprises, for example, an unsaturated hydrocarbon monomer or oligomer, and contains a photopolymerization initiator. The organic liquid 32 comprises, for example, an unsaturated hydrocarbon monomer or oligomer, but does not contain a photopolymerization initiator. The organic liquid 32 may further contain a photopolymerization inhibitor. The organic liquid 32 may share as common resist precursor material with the organic liquid 31, but lack a photopolymerization initiator. Alternatively, the organic liquid 32 may be the same material as the organic liquid 31, but further include a photopolymerization inhibitor.

In this context, "oligomer" refers to a polymeric material having a relatively low molecular weight, for example not more than 10,000 MW, composed of 2 to 200 polymerized monomers. Here, "polymer" has a molecular weight is more than 10,000 MW.

A method for dispensing the organic chemical 31 will be described. The wafer 20, on which the to-be-processed film 21 has been formed, is placed on the wafer stage 82. The wafer stage 82 is then moved to a position below the liquid dropping device 87a, and droplets of the organic chemical 31 are dispensed from the liquid dropping device 87a onto the to-be-processed film 21. The organic chemical 31 that has been dispensed onto the to-be-processed film 21 is within a shot area SI of the wafer 20. The shot area SI is an area to which the fine pattern is being transferred to in an imprinting operation. In some instances, the shot area SI may be referred to as a die area or device die region.

Next, the wafer stage 82 is moved to a position below the liquid dropping device 87b, and droplets of the organic chemical 32 are dispensed from the liquid dropping device 87b onto the to-be-processed film 21. The organic chemical 32 is dropped onto a perimeter portion of the shot area SI such that the droplets of the organic chemical 32 surround the previously dispensed organic chemical 31 in the shot area SI. The organic chemical 32 is preferably placed onto an area which, when the template 10 is pressed against the wafer 20, overlaps a peripheral edge portion of the template 10.

The dropping of the organic chemical 31 and the dropping of the organic chemical 32 may be performed in the reverse order from that explained above.

After the dispensing of the organic chemical 32, the wafer stage 82 is moved to a position below the template 10.

Figure 2B:
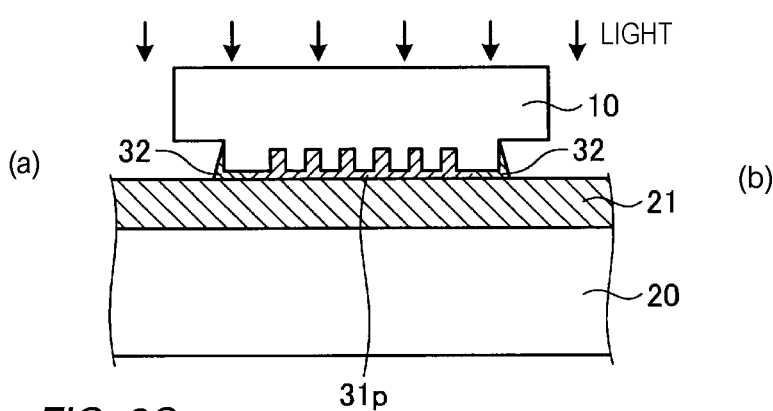
Figure 2B:
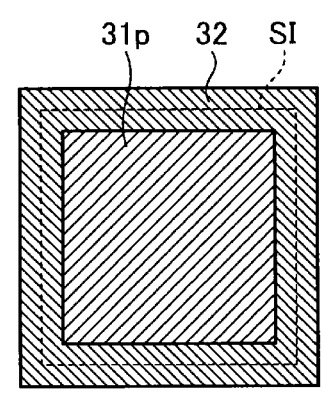

Next, as shown in FIG. 2B, the template stage 81 is moved downward to press the fine pattern of the template 10 against the organic chemicals 31, 32 while performing alignment by means of the alignment sensor 86. The organic chemical 31, which is placed in the shot area SI, enters and fills the recessed portions of the fine pattern of the template 10 by capillary action. The organic chemical 32, which is placed in the area that overlaps a peripheral portion of the template 10, is partly forced out beyond the outer edges of the template 10. The leaked organic chemical 32 moves up on the side wall of the template 10 by capillary forces.

Subsequently, while still pressing the template 10 against the organic chemicals 31, 32, these chemicals are irradiated with light emitted from the light source 89. In general, only the organic chemical 31 is cured by the light irradiation; the organic chemical 32 is not cured by exposure to light. The fine pattern of the template 10 is transferred through the curing of the organic chemical 31. The resist (cured organic chemical 31) to which the fine pattern has been transferred is referred to as a resist pattern 31p.

Figure 2C:
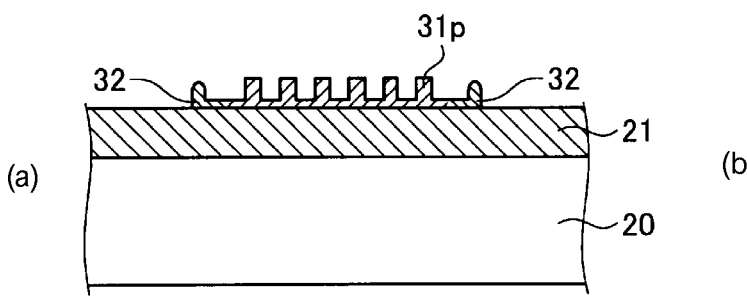
Figure 2C:
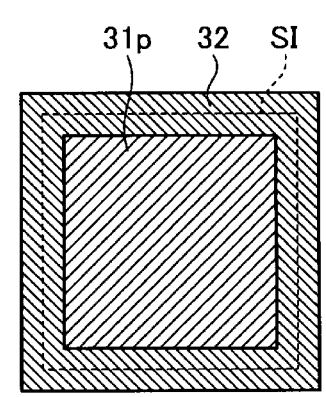

Next, as shown in FIG. 2C, the template 10 is detached from the wafer 20. The resist pattern 31p and the uncured organic chemical 32 remain on the to-be-processed film 21 of the wafer 20.

Figure 2D:
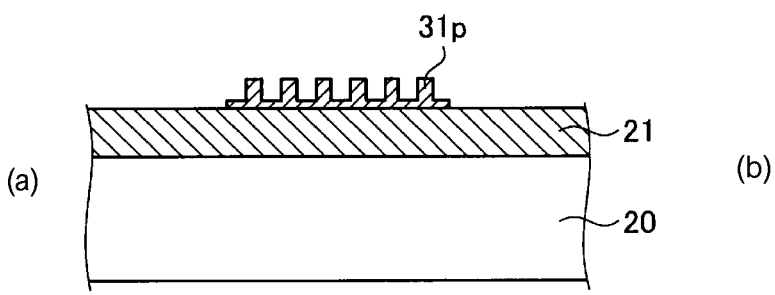
Figure 2D:
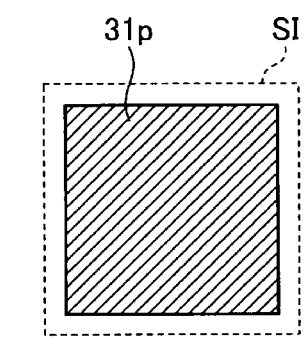

Next, as shown in FIG. 2D, the organic chemical 32 is cleaned off (e.g., with an organic solvent). Alternatively, the organic chemical 32 may be removed by letting it evaporate under reduced pressure (vacuum) or the like. In this manner, the resist pattern 31p is formed on the to-be-processed film 21.

Figure 3A:
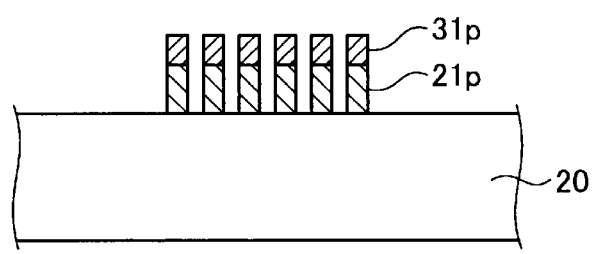
FIGS. 3A and 3B are flow diagrams illustrating aspects of a semiconductor device manufacturing method according to a first embodiment.

Next, as shown in FIG. 3A, the to-be-processed film 21 is processed using the resist pattern 31p as a mask to transfer the fine pattern and forming a to-be-processed film pattern 21p.

Figure 3B:
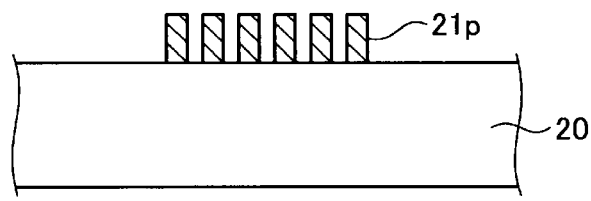

Next, as shown in FIG. 3B, the remaining resist pattern 31p is removed/stripped (e.g., by asking) to obtain the to-be-processed film pattern 21p on the wafer 20.

Subsequently, the same process as the above-described process is repeated to form a plurality of to-be-processed film patterns across the wafer 20. A semiconductor device can thus be manufactured.

COMPARATIVE EXAMPLE

A comparative imprinting apparatus includes only one liquid dropping device, which is used to dispense a photocurable organic chemical onto the shot area of a wafer. When a template is pressed against this dispensed organic chemical on the wafer, some part of the organic chemical in the shot area will generally leak out beyond the template edge and will move up the side wall of the template by capillary action. Thereafter, all organic chemical, including that lying under the template and that on the side wall of the template, will be cured by light. Consequently, the resulting resist pattern includes a leakage defect, which is a projection of cured resist material formed at the periphery of the resist pattern in a location beyond the intended shot area SI.

However, in Embodiment 1, the organic chemical 31 (photocuring liquid) is dropped onto the shot area SI of a wafer, while the organic chemical 32 (non-photocuring or inhibited liquid) is dropped onto a peripheral portion of the shot area SI such that the dispensed organic chemical 32 surrounds the organic chemical 31 on the shot area SI. The organic chemical 32 helps prevent the organic chemical 31 from leaking out beyond the edge of the template. Accordingly, the resist pattern 31p will not have a leakage detect when the organic chemical 31 is cured.

According to Embodiment 1, the organic chemical 32 is non-photocurable. Thus, if the organic chemical 32, placed on a peripheral portion of the shot area SI, leaks out beyond the template, the leaked organic chemical 32 will not be cured. Therefore, any leaked (or otherwise remaining) organic chemical 32 can be removed by cleaning it with an organic solvent or by letting it evaporate under reduced pressure. This makes it possible to reduce the occurrence of the leakage defects in the resist pattern 31p.

According to Embodiment 1, the use of an oligomer as the organic chemical 32 can increase the viscosity of the organic chemical 32. This makes it possible to more effectively prevent leakage of the organic chemical 31 from the template.

(Variation 1)

In the imprinting method of Variation 1, a saturated hydrocarbon material is used as a non-photocurable organic chemical (organic chemical 32). That is, non-photocurable organic chemical in Variation 1 does not have a polymerizable double bond (or any other polymerizable bond/group) and is thus not polymerizable, and therefore may or may not contain a photoinitiator since the material likes polymerizable bonds in any event. Since such a material is non-curable, substantially the same effect(s) as Embodiment 1 can still be achieved.

(Variation 2)

In the imprinting method of Variation 2, an unsaturated hydrocarbon oligomer having a polymerizable end group that requires an initiator/catalyst for polymerization is used in the non-photocurable organic chemical (organic liquid 32). However, the organic chemical 32 of Variation 2 does not contain a photoinitiator. In view of the absence of a photoinitiator such an organic chemical 32 will be non-curable when placed at the perimeter portion of the shot area SI.

However, since the organic chemical 32 of Variation 2 comprises an oligomer with a polymerizable end group, the organic chemical 32, can polymerize when it mixes with the organic chemical since the organic chemical 31 includes photoinitiator. Variation 2 can prevent a decrease in the polymerization of the organic chemical 31 at the perimeter of the shot area SI that might otherwise occur with mixing with a completely non-polymerizable organic chemical 32 (compare to Variation 1) at the boundary of the shot area SI.

EMBODIMENT 2

The imprinting method of the second embodiment (Embodiment 2) differs from the imprinting method of Embodiment 1 in the manner in which the organic chemicals 31, 32 are placed on a wafer.

The organic chemical 31 is again a photocurable resist material as in Embodiment 1. More specifically, the organic chemical 31 comprises, for example, an unsaturated hydrocarbon monomer or oligomer, and contains a photopolymerization initiator.

The organic chemical 32 is again a non-photocurable organic chemical as in Embodiment 1. More specifically, the organic chemical 32 comprises, for example, an unsaturated hydrocarbon monomer or oligomer, but does not contain a photopolymerization initiator. The organic chemical 32 in this Embodiment 2 preferably does not contain a photopolymerization inhibitor.

FIGS. 4A through 4D depict steps of a semiconductor device manufacturing method according to the second embodiment (Embodiment 2).

Figure 4A:
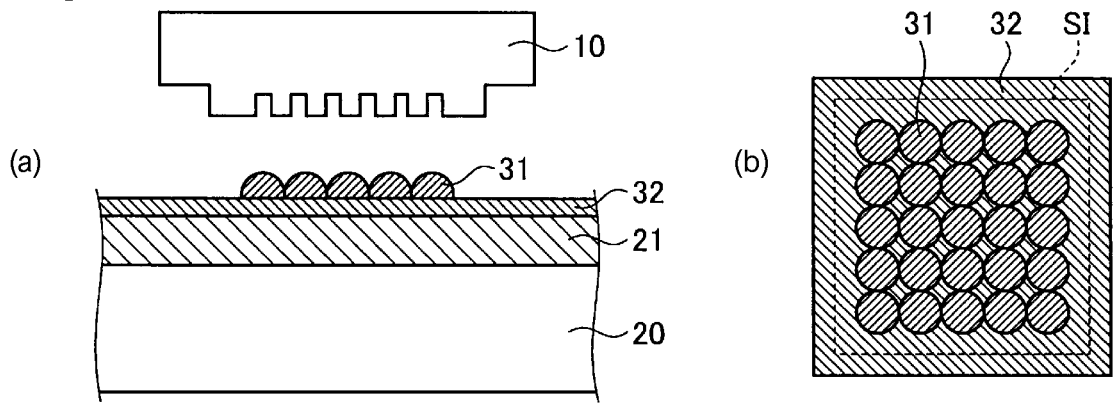
FIGS. 4A through 4D illustrate aspects of a semiconductor device manufacturing method according to a second embodiment.

As shown in FIG. 4A, in Embodiment 2, the organic chemical 32 is applied to the entire surface of a wafer 20 (e.g., by a spin-coating method using a spin coater). In view of this, the imprinting apparatus of Embodiment 2 need not necessarily include a plurality of liquid dropping devices since a single liquid dropping device for the organic chemical 31 may suffice.

The wafer 20, having a coating of the organic chemical 32 over the entire surface, is loaded into the imprinting apparatus, and then organic chemical 31 is dispensed onto the wafer 20 by means of a liquid dropping device of the imprinting apparatus. The organic chemical 31 is again dropped onto the to-be-processed film 21 to be within the shot area SI as in Embodiment 1. However, in this second embodiment, the organic chemical 31 is not directly dispensed onto the to-be-processed film 21, but is rather dispensed onto the previously formed coating of the organic chemical 32 already on the to-be-processed film 21.

Figure 4B:
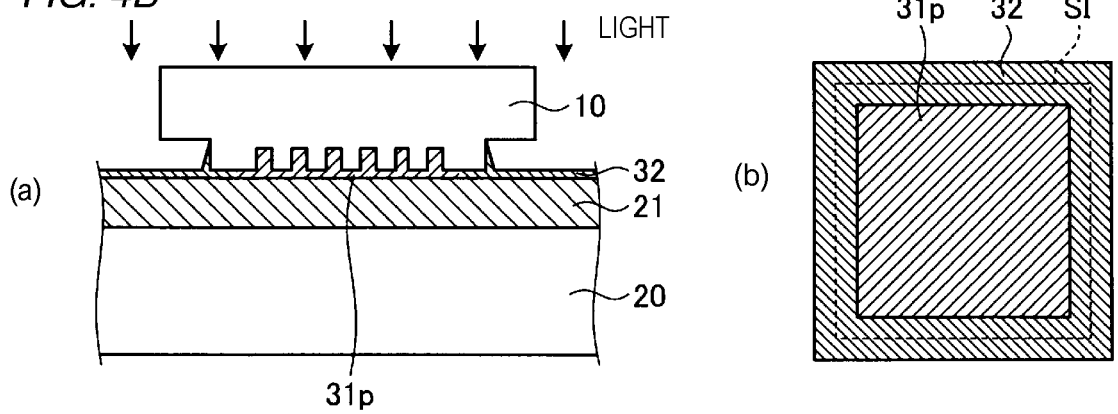

Next, as shown in FIG. 4B, the fine pattern of the template 10 is pressed against the organic chemicals 31, 32, and the organic chemicals 31, 32 are then irradiated with light.

The organic chemicals 31, 32 start to mix with each other immediately after the organic chemical 31 contacts the organic chemical 32. The mixing of the organic chemicals 31, 32 would be expected to be accelerated when they are pressed by the template 10. As described above, the organic chemical 32 al is also polymerizable (that is, it contains monomers/oligomers which can react in a polymerization reaction) when it mixes with the organic chemical 31. Therefore, the organic chemical 31 can still be cured without a significant decrease in the polymerization ability of the organic chemical 31 even when it mixes with the organic chemical 32 in the shot area SI.

On the other hand, the organic chemical 32 remains non-photocurable (due to either lack of photoinitiator and/or the presence of an inhibitor) in the perimeter portion of the shot area SI where the organic chemical 31 is absent. Therefore, since the organic chemical 32 will not photocure, it will not produce a leakage defect when it leaks out beyond the template 10 edge. Furthermore, the presence of the organic chemical 32 helps prevents the organic chemical 31 from leaking out beyond the template 10 edge.

Figure 4C:
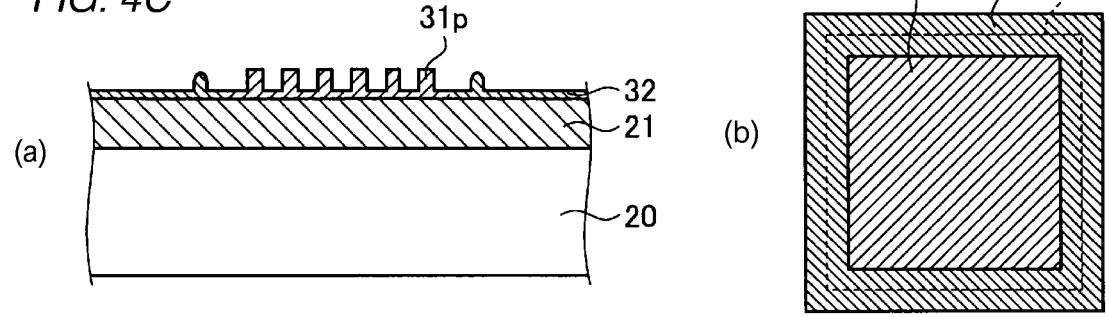

Next, as shown in FIG. 4C, the template 10 is detached from the wafer 20.

Figure 4D:
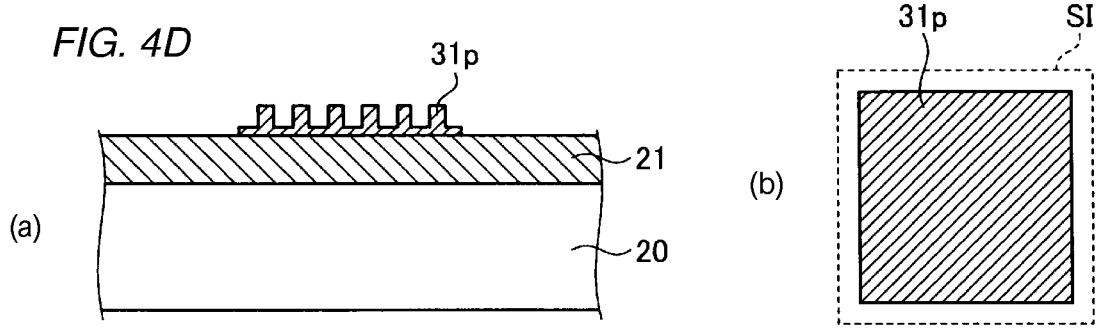

Next, as shown in FIG. 4D, the organic chemical 32 can be removed in a cleaning step (e.g., by an organic solvent wash) or by letting it evaporate under reduced pressure (vacuum) or the like. In this manner, a resist pattern 31p to which the fine pattern has been transferred is formed on the to-be-processed film 21 of the wafer 20.

Subsequently, the wafer 20 is subjected to the same processing as in Embodiment 1 to manufacture a semiconductor device.

The imprinting method of Embodiment 2 can achieve the substantially the same effect(s) as the of Embodiment 1.

According to Embodiment 2, the organic chemical 32 is applied to the wafer 20 prior to loading on the imprint tool. Therefore, there is no need to alter any existing imprinting apparatus so as, for example, to install a plurality of liquid dropping devices. This can avoid an increase in the manufacturing cost.

According to Embodiment 2, the organic chemical 31 (photocuring resist precursor) is dispensed onto the wafer 20 having a coating of the organic chemical 32 over the entire surface. This can simplify and facilitate alignment of positions on which the organic chemical 31 is to be dropped, thus making it possible to achieve substantially the same effect(s) of Embodiment 1 by a simplified method.

(Variation 1)

In the imprinting method of Embodiment 2, Variation 1, a saturated hydrocarbon is used as a non-photocurable organic chemical. The non-photocurable organic chemical of Variation 1 lacks any polymerizing bond/group, and thus may or may not contain a photopolymerization initiator.

While a mixture of the non-photocurable organic chemical of this Variation 1 and the organic chemical 31 may still polymerizable (by virtue of the polymerizable material of the organic chemical 31), the non-photocurable organic chemical 32 of this Variation 1, having no polymerizable group, does not exhibit any ability to be polymerized. It is therefore preferred to adjust the coating amount (that is, the thickness of the layer formed on the wafer 20) for the organic chemical 32 in this Variation 1 so that the ratio of the non-photocurable organic chemical 32 of this Variation 1 to the later dispensed organic chemical 31 will not be too high. This prevents the non-photocurable organic chemical of this Variation 1 from significantly inhibiting the polymerization (curing) of the organic chemical 31.

(Variation 2)

In the imprinting method of Embodiment 2, Variation 2, an unsaturated hydrocarbon oligomer having a polymerizable end group is used as a non-photocurable organic chemical (organic liquid 32). The non-photocurable organic chemical of this Variation 2 does not contain a photopolymerization initiator.

As described above, a mixture of the non-photocurable organic chemical of this Variation 2 and the organic chemical 31 is polymerizable. According to this Variation 2, since the non-photocurable organic chemical 32 incorporates a material with a polymerizable bond/group, this material can react (polymerize) with exposure to the photoinitiator of the organic chemical 31. In the case, since the non-photocurable organic chemical of this Variation 2 is applied to the entire surface of a wafer 20 in advance, mixing of the organic chemical 32 of this Variation 2 into the organic chemical 31 can occur over the entire shot area SI and not just at the perimeter of the organic chemical 31 in the shot area SI as in Embodiment 1. Therefore, the non-photocurable organic chemical 32 of this Variation 2, which can polymerize when it mixes with the organic chemical 31, can be used.

From the viewpoint of promoting mixing of the organic chemical 32 of this Variation 2 into the organic chemical 31, the organic chemical 32 of this Variation 2 is preferably composed of an oligomer having a lower viscosity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprinting method, comprising;
dispensing a first liquid on a first region of a substrate, the first liquid being a photocurable resist precursor, and the first region being an inner portion of a shot region that is one of a plurality of die areas on the substrate;
dispensing a second liquid on a second region of the substrate, the second region being adjacent to and surrounding the first region, the second region being an outer portion of the shot region, and the second liquid being non-photocurable as dispensed;
irradiating the first region with light while pressing a patterned template against the first liquid to cure the first liquid and form a resist pattern corresponding to the patterned template;
separating the patterned template and the substrate; and
selectively removing the second liquid from the substrate while leaving the resist pattern on the substrate.

2. The imprinting method according to claim 1, wherein the second liquid is coated on the substrate before the dispensing of the first liquid.

3. The imprinting method according to claim 2, wherein the second liquid is a saturated hydrocarbon.

4. The imprinting method according to claim 2, wherein the second liquid is an unsaturated hydrocarbon.

5. The imprinting method according to claim 4, wherein the unsaturated hydrocarbon is an oligomer having a polymerizable end group.

6. The imprinting method according to claim 1, wherein the second liquid is a saturated hydrocarbon.

7. The imprinting method according to claim 1, wherein the second liquid is an unsaturated hydrocarbon.

8. The imprinting method according to claim 7, wherein the second liquid includes a photopolymerization inhibitor.

9. The imprinting method according to claim 7, wherein the unsaturated hydrocarbon is an oligomer having a polymerizable end group.

10. The imprinting method according to claim 1, wherein the second liquid includes a photopolymerization inhibitor.

11. The imprinting method according to claim 1, wherein the second liquid is selectively removed from the substrate by vacuum-assisted evaporation.

12. The imprinting method according to claim 1, wherein the second liquid is selectively removed from the substrate in a solvent wash process.

* * * * *